(12) United States Patent
Cunningham et al.

(10) Patent No.: US 9,478,713 B2
(45) Date of Patent: Oct. 25, 2016

(54) NANOSTRUCTURE MATERIAL METHODS AND DEVICES

(71) Applicants: The Board of Trustees of the University of Illinois, Urbana, IL (US); Dow Global Technologies LLC, Midland, MI (US); Rohm and Haas Electronic Materials, LLC, Marlborough, MA (US)

(72) Inventors: Brian T. Cunningham, Champaign, IL (US); Gloria G. See, Champaign, IL (US); Peter Trefonas, Medway, MA (US); Jong Keun Park, Westborough, MA (US); Kishori Deshpande, Lake Jackson, TX (US); Jieqian Zhang, Southborough, MA (US); Jaebum Joo, Somerville, MA (US)

(73) Assignees: Rohm and Haas Electronic Materials LLC, Marlborough, MA (US); Dow Global Technologies LLC, Midland, MI (US); The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/723,433

(22) Filed: May 27, 2015

(65) Prior Publication Data

US 2015/0349212 A1 Dec. 3, 2015

Related U.S. Application Data

(60) Provisional application No. 62/003,258, filed on May 27, 2014.

(51) Int. Cl.
*H01L 33/50* (2010.01)
*H01L 33/02* (2010.01)
(Continued)

(52) U.S. Cl.
CPC ............. *H01L 33/50* (2013.01); *H01L 27/322* (2013.01); *H01L 31/0203* (2013.01); *H01L 33/005* (2013.01); *H01L 33/02* (2013.01); *H01L 2251/5369* (2013.01)

(58) Field of Classification Search
CPC ...... H01L 33/50; H01L 33/02; H01L 33/005
USPC .................................................... 257/79, 96
See application file for complete search history.

(56) References Cited

U.S. PATENT DOCUMENTS 6,829,269 B2  12/2004  Goodhue et al.
6,928,099 B2   8/2005  Ledentsov et al.
(Continued)

FOREIGN PATENT DOCUMENTS

CN  201985178 U   9/2011
CN  102280545 A  12/2011
(Continued)

OTHER PUBLICATIONS

Gloria G. See et al. "Region specific enhancement of quantum dot emission using interleaved two-dimensional 3hotonic crystals" Applied Optics vol. 54, No. 9, Mar. 20, 2015.

*Primary Examiner* — Minh-Loan Tran
*Assistant Examiner* — Farid Khan
(74) *Attorney, Agent, or Firm* — Mintz Levin Cohn Ferris Glovsky and Popeo, P.C.; Peter F. Corless

(57) ABSTRACT

In one aspect, structures are provided comprising: a substrate having a first surface and a second surface; and a polymeric layer disposed on the first surface of the substrate, the polymeric layer comprising a polymer and a plurality of light-emitting nanocrystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region.

15 Claims, 4 Drawing Sheets

(51) Int. Cl.
*H01L 33/00* (2010.01)
*H01L 31/0203* (2014.01)
*H01L 27/32* (2006.01)

(56) References Cited

U.S. PATENT DOCUMENTS

| | | | |
|---|---|---|---|
| 7,335,921 B2 | 2/2008 | Magn et al. | |
| 7,346,251 B2 | 3/2008 | Bose et al. | |
| 7,358,543 B2 | 4/2008 | Chua et al. | |
| 7,609,929 B2 | 10/2009 | Seol et al. | |
| 8,264,637 B2 | 9/2012 | Cho et al. | |
| 8,471,352 B2 | 6/2013 | Ellis et al. | |
| 8,576,472 B2 | 11/2013 | Ledentsov | |
| 2004/0124435 A1 | 7/2004 | D'Evelyn et al. | |
| 2005/0186565 A1 | 8/2005 | Malak | |
| 2005/0274944 A1* | 12/2005 | Jang | B82Y 20/00 257/40 |
| 2006/0110125 A1 | 5/2006 | Lin et al. | |
| 2006/0192225 A1 | 8/2006 | Chua et al. | |
| 2007/0025673 A1* | 2/2007 | Bose | B82Y 10/00 385/129 |
| 2007/0166874 A1 | 7/2007 | Lin et al. | |
| 2007/0172190 A1* | 7/2007 | Takagi | G02B 6/1225 385/131 |
| 2007/0237479 A1* | 10/2007 | Seol | B82Y 20/00 385/129 |
| 2008/0121844 A1* | 5/2008 | Jang | C09K 11/025 252/301.33 |
| 2008/0315177 A1 | 12/2008 | Bose et al. | |
| 2009/0212698 A1 | 8/2009 | Bailey | |
| 2009/0322218 A1* | 12/2009 | Wang | B82Y 20/00 313/504 |
| 2009/0323014 A1* | 12/2009 | Cunningham | G02B 5/28 351/44 |
| 2010/0035412 A1 | 2/2010 | Samuelson et al. | |
| 2010/0091224 A1* | 4/2010 | Cho | G02B 5/201 349/105 |
| 2010/0166976 A1 | 7/2010 | Lin et al. | |
| 2010/0238681 A1 | 9/2010 | Seubert et al. | |
| 2011/0026137 A1 | 2/2011 | Kato | |
| 2011/0068676 A1 | 3/2011 | Jeon et al. | |
| 2011/0273081 A1 | 11/2011 | Koh et al. | |
| 2012/0154417 A1 | 6/2012 | Ninan et al. | |
| 2012/0315714 A1 | 12/2012 | Shanks | |
| 2013/0092897 A1* | 4/2013 | Shambat | H01L 33/04 257/13 |
| 2013/0119409 A1 | 5/2013 | Zhao | |
| 2013/0146835 A1* | 6/2013 | Samuelson | B82Y 10/00 257/13 |
| 2013/0181208 A1 | 7/2013 | Guo | |
| 2013/0236388 A1 | 9/2013 | Bowers et al. | |

FOREIGN PATENT DOCUMENTS

| | | |
|---|---|---|
| CN | 202205811 U | 4/2012 |
| CN | 102447070 A | 5/2012 |
| CN | 102628805 A | 8/2012 |
| CN | 102636471 A | 8/2012 |
| CN | 103219443 A | 7/2013 |
| JP | 2006222394 A | 8/2006 |
| KR | 20130066965 A | 6/2013 |
| KR | 101301792 B1 | 8/2013 |
| WO | 2009066911 A2 | 5/2009 |
| WO | 2012177793 A1 | 12/2012 |
| WO | 2013067966 A1 | 5/2013 |
| WO | 2013152707 A1 | 10/2013 |

* cited by examiner

NANOSTRUCTURE MATERIAL METHODS AND DEVICES

CROSS-REFERENCE TO RELATED APPLICATION

This application claims priority to and the benefit of U.S. provisional patent Application No. 62/003,258 filed in the United States Patent and Trademark Office on May 27, 2014, the entire contents of which are incorporated herein by reference.

1. FIELD

In one aspect, structures are provided, comprising: a substrate having a first surface and a second surface; and a polymeric layer disposed on the first surface of the substrate, the polymeric layer comprising a polymer and a plurality of light-emitting nanocrystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region.

2. BACKGROUND

There are a broad range of application-specific needs for lighting and display technologies used in homes, workplaces and consumer products. Precise control of the output spectrum of lighting products is desirable to match the requirements for color temperature and output directionality, while at the same time optimizing power efficiency and manufacturing cost. See U.S. Pat. No. 8,692,446 and US 2013/0051032. For video display applications, controlling the blend of primary colors in each pixel is necessary, while the control of pixel output directionality must be tailored for a range of viewing methods that may be either tightly confined (for privacy) or widely dispersed (for wide viewing angle).

By varying the duty cycle, period, and refractive index, the resonant characteristics of photonic crystal (PC) structures can be tuned to interact with wavelengths extending from the ultraviolet to the infrared. Certain photonic crystal structures have been used for a variety of applications including polarizers, filters, biosensors, optical communication components, displays, and lighting, PCs have been incorporated into light emitting diodes (LEDs) in order to increase extraction efficiency, and to control the directionality of light output, either normal to the device or into angular sidelobes.

While certain photonic crystal structures have been reported, improved light-emitting structures are needed for many applications.

SUMMARY

We now provide new light-emitting structures and devices, and methods of making such structures and devices.

The power efficiency, spectral characteristics, and output directionality of light emitting diodes (LEDs) used for lighting and video display may be tailored by integrating nanostructures that interact with photon emitters. It has now been found that visible-wavelength-emitting nanostructure materials can be integrated within a polymer-based photonic crystal (PC) and excited by an ultraviolet-emitting LED. As discussed herein, the term nanostructure material includes quantum dot materials as well as nanocrystalline nanoparticle or nanocrystals that comprise one or more heterojunctions such as heterojunction nanorods.

The PC design incorporates distinct periods in orthogonal directions, enabling simultaneous resonant coupling of ultraviolet excitation photons to the one or more nanostructure materials and visible nanostructure material(s) emission to efficiently extract photons normal to the PC surface. The combined excitation and extraction enhancements result in an increase in the nanostructure material(s) output intensity. Multiple nanostructure material-doped PCs can be combined on a single surface to optimally couple with distinct populations of nanostructure materials, offering an ability for blending color output and directionality of multiple wavelengths. Devices can be fabricated upon flexible plastic surfaces by a manufacturable replica molding approach.

More particularly, in a first aspect, a light-emitting structure is provided that comprises:

a substrate having a first surface and a second surface; and a polymeric layer disposed on the first surface of the substrate, the polymeric layer comprising a polymer and one or more light-emitting nanostructure materials such as a plurality of light-emitting crystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region. In typical aspects, the first periodicity of a first region will be different from the first periodicity of a second region whereby distinct light-emitting nanocrystals in each region are selectively excited so as to emit light of distinct wavelengths in each region, for instance where light of a first wavelength (e.g. red) is emitted in the first region and light of a second wavelength (e.g. blue) is emitted in the second region. In preferred aspects, the first periodicity of a first region will be different from the first periodicity of a second region where the two respective first periodicities differ by more than 5% in the same measured value (e.g. distance between midpoints of nearest neighbor recesses in each of the first regions), more typically where the two respective first periodicities differ by at least 10%, 15%, 20%, 25%, 30%, 35%, 40%, 45%, 50% or 70% in the same measured value (e.g. distance between mid-points of nearest neighbor recesses in each of the first regions).

In preferred embodiments, the second periodicity of the first region is at least substantially the same as the second periodicity of the second region. In typical aspects, the second periodicity of a first region will be at least substantially the same as the second periodicity of a second region so as to outcouple the same source of incoming light, including UV radiation. For instance, in certain preferred aspects, the second periodicity of a first region will be at least substantially the same as the second periodicity of a second region where the two respective second periodicities differ no more than 5% in the same measured value (e.g. distance between mid-points of nearest neighbor recesses in each of the second regions), more typically where the two respective second periodicities differ no more than 4%, 3%, 2%, 1% or 0.5% in the same measured value (e.g. distance between mid-points of nearest neighbor recesses in each of the second regions). Limitations on fabrication techniques may result in the two respective second periodicities being not precisely the same.

The polymeric layer can comprise a plurality of first regions and a plurality of second regions. In certain embodiments, the first and second regions are in an alternating relationship to each other.

In certain embodiments, the one or more light-emitting nanostructure materials comprise one or more heterojunctions. In certain embodiments, the one or more light-emitting nanostructure materials comprise quantum dots. In certain embodiments, the substrate is optically transparent. In certain embodiments, a layer of a material having a higher index of refraction than the polymeric layer is disposed on the patterned surface of the polymeric layer. In certain embodiments, the second direction intersects the first direction at an angle of from 65 to 115°. In certain embodiments, the second direction is substantially orthogonal to the first direction.

In another aspect, the invention provides a light-emitting apparatus, comprising:
a structure comprising:
a substrate having a first surface and a second surface;
a polymeric layer disposed on the first surface of the substrate, the polymeric layer comprising a polymer and one or more light-emitting nanostructure materials such as a plurality of light-emitting crystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region;
a layer of a material having a higher index of refraction than the polymeric layer is disposed on the patterned surface of the polymeric layer; and
a light source arranged to provide light to the second surface of the substrate.

As discussed above, in typical aspects, the first periodicity of a first region will be different from the first periodicity of a second region whereby distinct light-emitting nanocrystals in each region are selectively excited so as to emit light of distinct wavelengths in each region, for instance where light of a first wavelength (e.g. red) is emitted in the first region and light of a second wavelength (e.g. blue) is emitted in the second region. In preferred aspects, the first periodicity of a first region will be different from the first periodicity of a second region where the two respective first periodicities differ by more than 5% in the same measured value (e.g. distance between mid-points of nearest neighbor recesses in each of the first regions), more typically where the two respective first periodicities differ by at least 10%, 15%, 20%, 25%, 30%, 35%, 40%. 45%, 50% or 70% in the same measured value (e.g. distance between mid-points of nearest neighbor recesses in each of the first regions).

In preferred embodiments, the first periodicity is operable to outcouple light emission in a defined direction. In certain embodiments, the first periodicity is operable to outcouple light emission in a direction that is normal to the first surface of the substrate.

In another aspect, a structure is provided comprising a polymeric layer comprising a polymer and one or more light-emitting nanostructure materials such as a plurality of light-emitting nanocrystals; wherein the polymeric layer comprises first and second regions, each region having a first periodicity in a first direction, and a second periodicity in a second direction which intersects the first direction.

In a further aspect, methods are provided for forming a light-emitting system comprising forming a structure of the invention. In certain embodiments, the polymeric layer of the system comprises a plurality of first regions and a plurality of second regions.

The invention also provides devices obtained or obtainable by the methods disclosed herein, including a variety of light-emitting devices, photodetectors, chemical sensors, photovoltaic device (e.g. a solar cell), transistors and diodes, as well as biologically active surfaces that comprise the systems disclosed herein.

Other aspects of the invention are disclosed infra.

DETAILED DESCRIPTION

We have now found that the resonant modes of a photonic crystal can be engineered to occur at specific combinations of angle and wavelength, allowing light of a selected wavelength and incident direction to couple to the photonic crystal and excite a highly localized electromagnetic standing wave with an amplitude that is substantially greater than the original illumination source. This can be accomplished by e.g. an appropriate choice of dielectric materials and material dimensions. Nanostructure materials including quantum dots that down-convert light from a broad band of excitation wavelengths to a very specific emission wavelength, have been successfully incorporated into photonic crystals with specific resonances designed to couple to the relevant excitation and/or emission wavelengths of the nanostructure material. We have found that by introducing asymmetry into the photonic crystal structure, through the use of different periods in orthogonal directions, a photonic crystal may incorporate multiple resonances at widely varied wavelengths so as to interact simultaneously with the excitation and emission spectra of the integrated nanostructure material emitters to enhance the number of photons generated by the nanostructure material (e.g. quantum dots), while increasing the efficiency of emitted photons that reach a viewer.

We have now demonstrated that structures comprising a polymeric layer comprising a polymer and one or more light-emitting nanostructure materials such as a plurality of light-emitting nanocrystals, the polymeric layer having a patterned surface including first and second regions, and disposed on a surface of a substrate, can be tailored to provide a desired output spectrum of light.

We have found the present structures can provide a number of performance benefits. In particular, the present structures can combine enhancement of the excitation and extraction of the light output of light-emitting nanocrystals.

Thus, in one aspect, the invention provides a structure comprising:
a substrate having a first surface and a second surface; and
a polymeric layer disposed on the first surface of the substrate, the polymeric layer comprising a polymer and one or more light-emitting nanostructure materials such as a plurality of light-emitting nanocrystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region.

Figure 1:
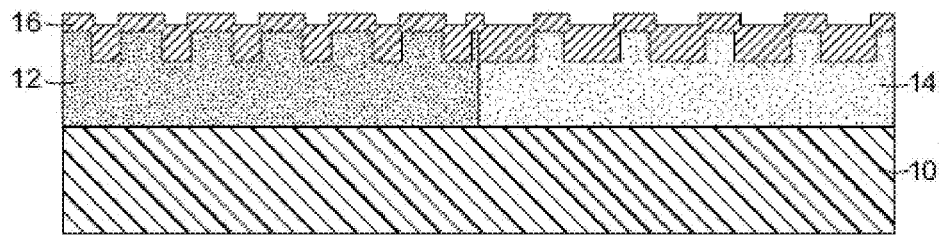
FIG. 1 shows an exemplary device according to the present invention.

FIG. 1 is an illustration of an exemplary device according to the invention. As seen in FIG. 1, a polymer layer is applied in first region 12 and second region 14 on substrate 10. The polymer layer incorporates a plurality of light-emitting nanocrystals. A layer 16 of a material having a higher index of refraction than the polymeric layer may be disposed on the patterned surface of the polymeric layer.

The substrate can be made of any rigid or flexible material, suitably a material that is optically transparent in a desired wavelength range. For example, the substrate can he made of glass, cellulose acetate, or polymeric materials such as polyethylene terephthalate, polyimides, polycarbonate, polyurethane, and the like. The substrate can have any suitable thickness, for example, from 1 micron to 1 mm in thickness.

The polymer applied to the substrate 10 can be any suitable polymeric material, including polyethylene terephthalate, polyimides, polycarbonate, polyurethane, and the like. Preferred polymeric materials include lauryl methacrylate (LMA), ethyl glycol dimethacrylate (EGDMA) and mixtures thereof. The polymer layer can optionally be adhered to the substrate with an optically transparent adhesive such as NOA 61 (Norland Products, Inc.).

The patterned first region 12 and the patterned second region 14 of the patterned surface each have a plurality of recesses. In each patterned region, the plurality of recesses has periodicity; e.g., the plurality of recesses are spaced equally or other regular or repeating arrangement along a specified dimension on the surface. The plurality of recesses can be formed integrally with the polymeric layer, e.g., by coating a polymer solution onto a patterned master template. Alternatively, the plurality of recesses can be formed by first forming a substantially flat or planar-polymer layer on the substrate, and then patterning the polymeric layer, e.g., by stamping with a patterned die. In a further alternative, microstructures such as ridges, lenslets, pyramids, trapezoids, round or square shaped posts, or curved sided cone structures (see, e.g., U.S. Patent Application Publication No. 2010/0128351) are formed or applied on the polymeric layer by deposition of a material on the surface of the polymeric layer, thereby defining the plurality of recesses on the polymeric layer.

The plurality of recesses within each of the first region and the second region are suitably periodic in two dimensions, that is, nearest neighbor recesses are spaced equally or in other regular or repeating pattern in two different directions (i.e., a first direction and a second direction) along the surface. Thus, the patterned first region 12 of the polymer layer has a first periodicity in a first direction and a second periodicity in a second direction, and the patterned second region 14 of the polymer layer has a first periodicity in a first direction and a second periodicity in a second direction. The first periodicity in the first direction of the first patterned region and the first periodicity in the first direction of the second patterned region may be the same, or may advantageously be different. Similarly, the second periodicity in the second direction of the first patterned region and the second periodicity in the second direction of the second patterned region may be the same, or may be different. In certain embodiments, the second periodicity of the first region is the same as the second periodicity of the second region.

The spacing of recesses can be selected to produce one or more resonances at one or more selected wavelengths so as to interact simultaneously with the excitation and emission spectra of the integrated light-emitting nanocrystals in the polymer layer, as discussed below, as a means of enhancing the number of photons generated by each nanostructure material (e.g., quantum dot). Rigorous coupled wave analysis can be used to predict the resonant wavelengths and electromagnetic field distributions at the resonant wavelengths for a given spacing or recesses. Thus, for example, recesses having a spacing of 250 nm can provide a resonance at 490 nm, while recesses having a spacing of 340 nm can provide a resonance at 590 nm. In certain embodiments, the spacings in both first and second directions are less than 1 micron.

In certain embodiments, the second direction of periodic recesses within the first and/or second region intersects the first direction of periodic recesses at an angle of from 65 to 115°. In certain embodiments, the second direction is substantially orthogonal to the first direction.

In certain embodiments, the polymeric layer comprises a plurality of first regions and a plurality of second regions. The plurality of first and second regions can be arranged on the substrate in any desired pattern, such as a checkerboard pattern. In certain embodiments, the first and second regions are in an alternating relationship to each other.

When the layer 16 is present, the layer can be of any optically transparent material having a higher index of refraction than material of the polymeric layer. Suitable materials for the layer 16 include titanium dioxide ($TiO_2$) or other suitable high refractive index inorganic oxide. The layer 16 can be deposited by coating (e.g., spin coating, spray coating, dip coating), sputtering, or other methods for depositing a layer of material on the polymeric layer without disturbing the patterning of the polymeric layer. The thickness of the layer 16 can be used to tune the resonant wavelength of the periodic recesses. When the layer 16 is $TiO_2$, a suitable thickness is from about 50 nm to about 500 nm, e.g., about 85 nm.

In another aspect, the invention provides a light-emitting apparatus comprising:
a structure comprising (i) a substrate having a first surface and a second surface; (ii) a polymeric layer disposed on the first surface of the substrate, the polymeric layer comprising a polymer and one or more light-emitting nanostructure materials such as a plurality of light-emitting nanocrystals; the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region;

and (iii) a layer of a material having a higher index of refraction than the polymeric layer is disposed on the patterned surface of the polymeric layer; and a light source arranged to provide light to the second surface of the substrate.

The light source can be any suitable source of ultraviolet (UV) or visible light, e.g., light in the range of 200 nm<λ<700 nm including an LED.

In preferred embodiments, the first periodicity is operable to outcouple light emission in a defined direction. As used herein, the term "outcouple" or "outcoupling" refers to conversion of substrate and I/O modes of light emission to external modes of light emission, thereby enhancing light output from the device. In certain embodiments, the first periodicity is operable to outcouple light emission in a direction that is normal to the first surface of the substrate. In certain embodiments, the second periodicity of the first region is the same as the second periodicity of the second region.

As discussed above, the term "nanostructure material", as used herein, includes quantum dot materials as well as nanocrystalline nanoparticles (nanoparticles or nanocrystals) that comprise one or more heterojunctions such as heterojunction nanorods. Nanostructure materials, including nanocrystals and quantum dots, are semiconductor materials having a nanocrystal structure and sufficiently small to display quantum mechanical properties. See U.S. Published Application 2013/0056705 and U.S. Pat. No. 8,039,847. See also US 2012/0234460 and US 20130051032.

Thus, as discussed above, the term nanostructure material as used herein includes both quantum dot materials as well as nanocrystalline nanoparticles (nanoparticles) that comprise one or more heterojunctions such as heterojunction nanorods.

A quantum dot suitably may be Group II-VI material, a Group III-V material, a Group V material, or a combination thereof. The quantum dot suitably may include e.g. at least one selected from CdS. CdSe, CdTe, ZnS, ZnSe, ZnTe, HgS, HgSe, HgTe, CiaN, Gal), GaAs, InP and InAs. Under different conditions, the quantum dot may include a compound including two or more of the above materials. For instance, the compound may include two or more quantum dots existing in a simply mixed state, a mixed crystal in which two or more compound crystals are partially divided in the same crystal e.g., a crystal having a core-shell structure or a gradient structure, or a compound including two or more nanocrystals. For example, the quantum dot may have a core structure with through holes or an encased structure with a core and a shell encasing the core. In such embodiments, the core may include e.g. one or more materials of CdSe, CdS, ZnS, ZnSe, CdTe, CdSeTe, CdZnS, PhSe, AgInZnS, and ZnO. The shell may include e.g. one or-more materials selected from CdSe, ZnSe, ZnS, ZnTe, CdTe, PbS, TiO, SrSe, and HgSe.

Passivated nanocrystalline nanoparticles (nanoparticles) that comprise a plurality of heterojunctions suitably facilitate charge carrier injection processes that enhance light emission when used as a device. Such nanoparticles also may be referred to as semiconducting nanoparticles and may comprise a one-dimensional nanoparticle that has disposed at each end a single endcap or a plurality of endcaps that contact the one-dimensional nanoparticle. The endcaps also may contact each other and serve to passivate the one-dimensional nanoparticles. The nanoparticles can be symmetrical or asymmetrical about at least one axis. The nanoparticles can be asymmetrical in composition, in geometric structure and electronic structure, or in both composition and structure. The term heterojunction implies structures that have one semiconductor material grown on the crystal lattice of another semiconductor material. The term one-dimensional nanoparticle includes objects where the mass of the nanoparticle varies with a characteristic dimension (e.g., length) of the nanoparticle to the first power. This is shown in the following formula (1): $M \alpha\ L^d$ where M is the mass of the particle, L: is the length of the particle and d is an exponent that determines the dimensionality of the particle. Thus, for instance, when d=1, the mass of the particle is directly proportional to the length of the particle and the particle is termed a one-dimensional nanoparticle. When d=2, the particle is a two-dimensional object such as a plate while d=3 defines a three-dimensional object such as a cylinder or sphere. The one-dimensional nanoparticles (particles where d=1) includes nanorods, nanotubes, nanowires, nanowhiskers, nanoribbons and the like. In one embodiment, the one-dimensional nanoparticle may be cured or wavy (as in serpentine), i.e. have values of d that lie between 1 and 1.5.

Exemplary preferred materials are disclosed in patent application Ser. Nos. 13/834,325 and 13/834,363, both incorporated herein by reference.

The one-dimensional nanoparticles suitably have cross-sectional area or a characteristics thickness dimension (e.g., the diameter for a circular cross-sectional area or a diagonal for a square of square or rectangular cross-sectional area) of about 1 nm to 10000 nanometers (nm), preferably 2 nm to 50 nm, and more preferably 5 nm to 20 nm (such as about 6, 7, 8, 9, 10, 11, 12, 13. 14, 15, 16, 17. 18, 19 or 20 nm) in diameter. Nanorods are suitably rigid rods that have circular cross-sectional areas whose characteristic dimensions lie within the aforementioned ranges. Nanowires or nanowhiskers are curvaceous and have different or vermicular shapes. Nanoribbons have cross-sectional area that is bounded by four or five linear sides. Examples of such cross-sectional areas are square, rectangular, parallelopipeds, rhombohedrals, and the like. Nanotubes have a substantially concentric hole that traverses the entire length of the nanotube, thereby causing it to be tube-like. The aspect ratios of these one-dimensional nanoparticles are greater than or equal to 2, preferably greater than or equal to 5, and more preferably greater than or equal to 10.

The one-dimensional nanoparticles comprise semiconductors that suitably include those of the Group II-VI (ZnS, ZnSe, ZnTe, CdS, CdTe, I IgS, I IgSe, IlgTe, and the like) and III-V (GaN, CiaP, GaAs, CiaSh, InN, InP, InAs, InSb, AlAs, AlP, AlSb, and the like) and IV (Ge, Si, Pb and the like) materials, an alloy thereof, or a mixture thereof.

Nanostructure materials including quantum dot materials are commercially available and also may be prepared for example by a standard chemical wet method using a metallic precursor as well as by injecting a metallic precursor into an organic solution and growing the metallic precursor. The size of the nanostructure material including quantum dot may be adjusted to absorb or emit light of red (R), green (G), and blue (B) wavelengths, Thus, a light-emitting nanocrystal may be selected to absorb or emit light of a selected wavelength or wavelength range.

The light-emitting nanostructure materials such as nanocrystals or quantum dots can be incorporated into the polymer layer by addition of a suspension or solution of the nanostructure materials (e.g. nanocrystals or quantum dots) to a monomer solution, followed by coating of the polymer solution onto the substrate and curing of the polymer solution to provide the polymer with embedded nanocrystals or quantum dots.

The present structures can combine enhancement of the excitation and extraction of the light output of light-emitting nanocrystals. In certain embodiments, the enhancement of the excitation and extraction of the light output of light-emitting nanocrystals can be 2×, 3×, 4×, 5×, or 10× of the light output of the light-emitting nanocrystals.

The following examples are illustrative of the invention.

Example 1

In this example, as also shown in Figure (a), quantum dots (QDs) were incorporated into a replica-molded flexible polymer-based PC structure that was excited by a UV backlight LED. The UV excitation source couples to a resonant mode of the PC, which creates an enhanced excitation at the coupling wavelength by increasing the magnitude of the electric field experienced by the QDs in the PC, thus producing greater photon output than would occur without a PC structure. The asymmetric PC is designed to produce a resonance at the wavelength of QD emission, resulting in photon emission that is efficiently channeled normal to the PC surface. As further shown in FIG. 2, an interleaved surface was designed and fabricated in a checkerboard pattern, containing two PC designs. While both regions were designed to produce resonances for the same UV excitation wavelength, each region was optimized for a different QD emission wavelength. Thus, a single surface, populated with a mixture of QDs, can be tailored by selection of the relative surface area represented by each PC design to produce a specific overall output spectrum.

Materials and Methods

A silicon wafer was fabricated to serve as a "master" template for the replica molding process, and thus contains a negative surface image of the desired PC grating structure. The master's grating structure was fabricated via electron beam lithography on a layer of thermally-grown $SiO_2$ on a Si wafer, upon which reactive ion etching was used to produce 80 nm tall pillars, as shown in FIG. 2(c). The patterned device area was 3×3 $mm^2$. To facilitate the clean removal of the replica from the master, the wafer was cleaned with a piranha solution (3:1 (v/v) mixture of sulfuric acid and hydrogen peroxide) for 20 min, rinsed with DI water (MilliQ), and dried with $N_2$. Next, a vapor-phase deposition of (tridecafluoro-1,1,2,2-tetrahydrooctyl)trichlorosilane (No-Stick, Alfa Aesar) was performed by placing the wafer into an enclosed container with two drops of the No-Stick solution for 1 h.

CdSeS/ZnS alloyed QDs were purchased from Sigma-Aldrich (6 nm. 1 mg/ml in toluene, oleic acid as ligand), or synthesized for this application by coating with oleic acid ligand, then purified twice using precipitation and centrifugation with ethanol and methanol. Lauryl methacrylate (LMA) and ethylene glycol dimethacrylate (EGDMA) (Sigma-Aldrich) were purified to remove the inhibitor with an inhibitor-removal column (Sigma-Aldrich) before their use.

The UV curable polymer, consisting of 182 μl, of LMA and 18 μl, of EGDMA, was mixed in a flask, and 4 mL of the QD hexane solution and 8 μL oleic acid was added and mixed well, then 20 μL of PLMA monopolymer solution (Scientific Polymer Products, Inc.) was added to increase the viscosity. The remaining solvent was removed using a rotavap at room temperature and 2 μL of initiator (Darocur 1173, Sigma-Aldrich) was added immediately before spin coating. The solution was spin coated onto the master wafer at 600 rpm for 30 s, then immediately polymerized by exposure to a high intensity UV lamp for 30 min in a nitrogen atmosphere glovebox.

After the film was fully cured, a layer of NOA 61 (Norland Products Inc,) was drop coated over the composite film. An acetate sheet (Optigrafix Acetate) substrate, selected for low birefringence, was then placed over the master wafer and brought into contact with the uncured NOA drops to form a thin continuous layer between the acetate sheet and the composite thin film. Next, the NOA was cured for 10 min using a UV lamp under ambient conditions. The acetate substrate, along with the NOA layer and composite thin film, was then released from the master wafer with the thin film of QD-PLMA containing the replicated 2D cavity structure. After replica molding, $TiO_2$ was deposited by sputtering (K.J. Lesker Dual-Gun Sputter System) to the depth required for resonance at the desired wavelength. Deposition times were restricted to keep the substrate temperature from exceeding 40° C., to avoid thermally induced damage to the polymer materials, which sometimes required multiple layers of $TiO_2$, deposition to reach the correct thickness.

Device Structure

The device structure interleaves the regions of two distinct 2D PCs in a checkerboard pattern. Each region consists of rectangular cavities, as shown in FIG. 2(b), with resonances created by the periodic variation in the orthogonal directions on the surface. Each region varies in one direction with dimensions selected to provide enhancement from the same UV excitation source (200 nm period with 40% and 70% duty cycles in Regions 1 and 2, respectively), while the orthogonal directions have larger feature sizes for producing resonances at visible wavelengths. The larger features in Region 1 have a lateral width of 250 nm to produce resonances at $\lambda=490$ nm, while the features in Region 2 have a lateral width of 340 nm, designed to produce resonances at $\lambda=590$ nm, i.e. a first periodicity of the first region is different from the first periodicity of the second region. In this device, a second periodicity of that first region is at least substantially the same as the second periodicity of that second region. For both regions, the structure is formed from a QD-doped polymer with a grating depth of 80 nm that is coated with an 85 nm thin film of $TiO_2$. While the period of the structure is the main determinant of the resonant wavelength, the resonances can also be tuned via control of the $TiO_2$ thickness.

Figure 2:
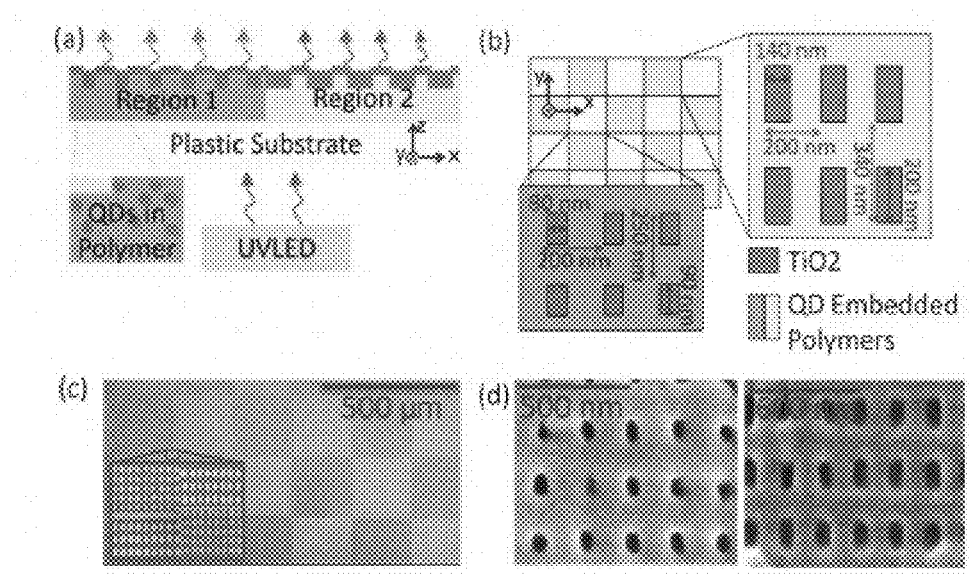
FIG. 2 (which includes FIGS. 2a through 2d) shows exemplary embodiments of devices according to the present invention.
Figure 3:
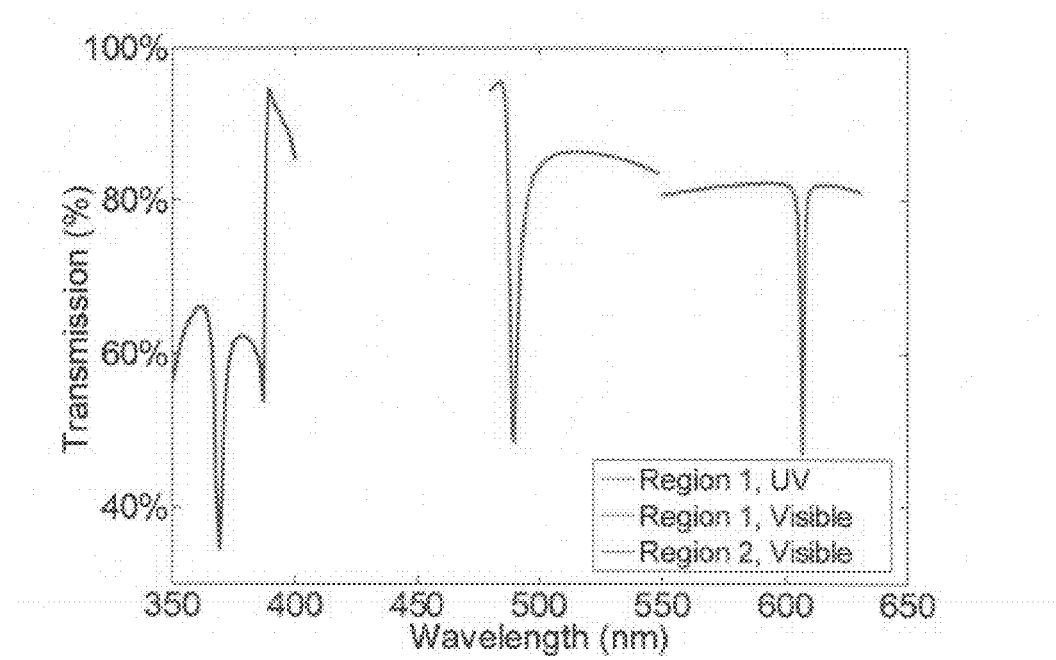
FIG. 3 shows simulated transmission spectra of target resonances.

The PC structures were designed using rigorous coupled wave analysis (Rsoft, DiffractMod) to predict the resonant wavelengths and electromagnetic field distributions at the resonant wavelengths, by evaluating a unit cell of the PC with periodic boundary conditions in both the x- and y-directions, as indicated in FIG. 2. Note that, due to the large difference between the refractive index of $TiO_2$ in the UV (n=2.87) and the visible (n=2.61 at $\lambda=590$ nm), separate simulations were carried out for unpolarized incident light in two wavelength bands (350<$\lambda$<450 nm, and 450<$\lambda$<800 nm) and plotted together for each PC region. The simulation results (FIG. 3) show large dips in the transmission efficiency at the wavelengths for which guided mode resonance occurs. Both regions have resonances in the UV near $\lambda=370$ nm, and Region 1 has a resonance near $\lambda=490$ nm, while Region 2 has a resonance near $\lambda=600$ nm. These visible wavelength resonances are designed to overlap with the emission spectra of QDs incorporated into the PC. The 2D PC structure produces several additional resonance modes caused by the variation in feature sizes experienced by the unpolarized incident light. Also, although in a one dimensional PC, the TM mode (with both x and z-directional components) and the TE mode (with components in the y-direction) can be isolated, they are both present as TE- and TM-like modes in a 2D PC, which leads to additional resonances at wavelengths other than those required by the design.

Results

The emission properties of the devices were measured using a UV LED (Thor Labs, Ultra Bright Deep Violet LED) centered at $\lambda=375$ with a 20 nm full-width half-maximum as the excitation source. A $350<\lambda<390$ nm bandpass filter was used to eliminate any non-UV emission from the LED. The LED output was collimated before illuminating the PC. The device was mounted over a cover with a 3 mm diameter aperture, assuring that only the patterned PC region was excited and measured.

The device under test was mounted to a motorized rotary stage, allowing the incident excitation angle to be varied. The output passed through a UV filter to eliminate any light from the excitation source, then was collected by a collimating lens attached to an optical fiber. The fiber was connected to a spectrometer (USB2000+, Ocean Optics) from which the emission can be measured and observed through the LabView OmniDriver software which also controlled the rotation position of the stage in 0.1 degree steps.

To measure the impact of the extraction angle, the same equipment was used, but instead of mounting the PC sample to a rotation stage and varying the excitation angle, the PC sample position was fixed. The collimator coupled to the optical fiber was instead mounted on the stage and rotated around the PC, allowing extracted light to be collected over a range of angles with respect to the PC surface.

The photonic band diagram of a device was determined using the same experimental setup as that to measure the excitation output, but the UV LED and associated bandpass filter were replaced with a tungsten-halogen lamp coupled to an optical fiber that outputs unpolarized light through a collimator, then the broadband transmission was measured across a range of angles.

Figure 4:
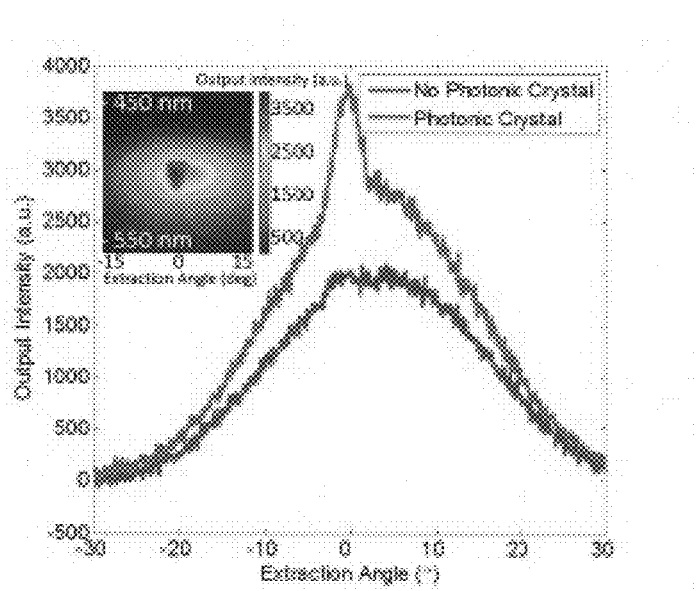
FIG. 4 shows the impact of quantum dot extraction with and without a photonic crystal (PC) structure present.

In the sample with QDs emitting at a peak wavelength of $\lambda=505$ nm, the extraction was measured before and after a deposition of 20 nm of $TiO_2$ to compare the output intensity with and without a photonic crystal structure, as shown in FIG. 4. There is an asymmetry in the UV-LED output beam, which creates as asymmetry in the QD emission both with and without the PC. However, with the PC present, an increase by a factor of 2 is present in the measured output intensity of the extraction angle-dependent OD emission. The narrow, angle dependent enhancement is due to the variation in extraction angle, while the broader enhancement across all measured angles is due to the enhanced excitation over the entire PC area.

Figure 5:
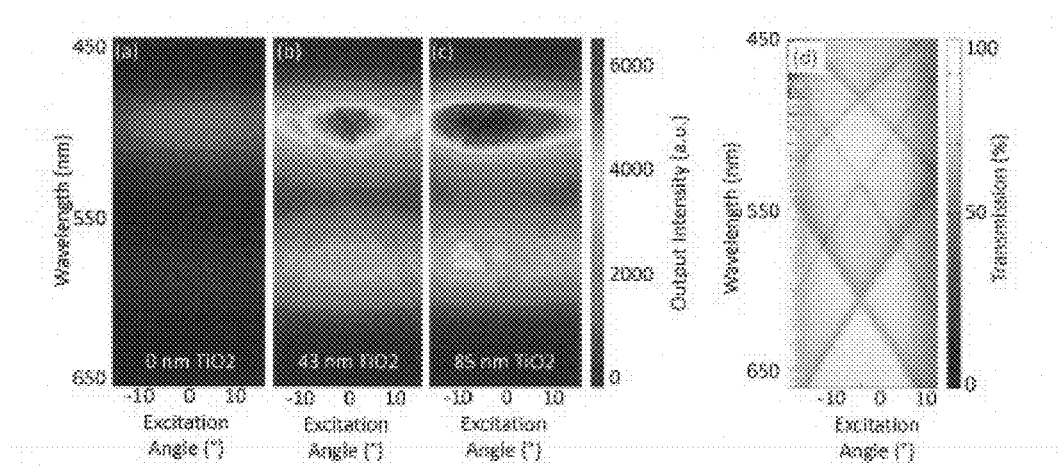
FIG. 5 (which includes FIGS. 5A, 5B, 5C and 5D) shows a comparison of the angle dependence of excitation at different stages of $TiO_2$ deposition.

In order to demonstrate the ability of the PC to selectively enhance a sub-population of embedded QDs, a sample containing a homogeneous mixture QDs, with emissions centered at $\lambda=490$ nm and $\lambda=585$ nm was fabricated. The emission was measured on a QD doped grating structure without PC resonances by measuring the emission of a structure without $TiO_2$ (FIG. 5(*a*)) and after the PC is formed by deposition of a 43 nm $TiO_2$ thin film (FIG. 5(*b*)). The maximum QD emission increased by 4 times for the 490 nm QDs and 5 times for the 585 nm QDs, shown in FIG. 5(*b*), but only within the regions in which their emission matched their corresponding PC resonance. To adjust the resonance conditions of the PC for enhancing the emission wavelengths of both types of QDs, an additional 42 nm of $TiO_2$ was deposited, and that resulted in a total increase of 4.2 times for the 490 nm QDs and 5.8 times for the 585 nm QDs (FIG. 5(*c*)), as the resonance conditions of the PC were red-shifted by the thicker $TiO_2$ layer. FIG. 5(*d*) shows the photonic bandgap of the structure with the total of 85 nm of $TiO_2$, where the darker bands indicate the wavelength and angle coupling leading to resonance within the PC. These bands correspond to the bands of enhancement seen in FIG. 5(*c*) within the QD emission.

Figure 6:
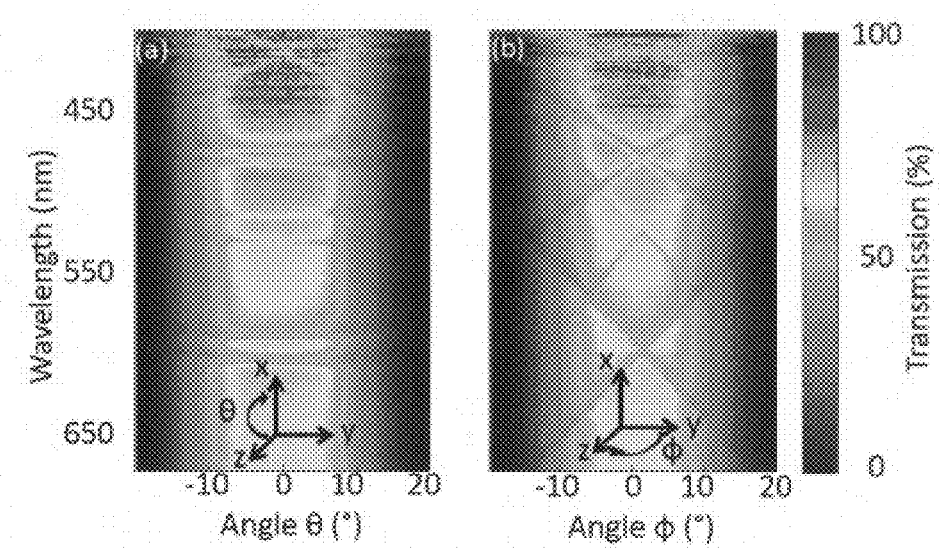
FIG. 6 (which includes FIGS. 6A and 6B) shows angle dependence of transmission measured with angle variations along 0 and 0).

Because the device structure has a different period in each orthogonal direction, the transmission efficiency can be measured over the range of angles across θ that vary with the shorter, UV resonant features or the Φ angle with the larger features that couple to visible wavelengths. The difference in the two photonic bands is shown in FIG. 6. In FIG. 6(*a*), the angle θ is varied, there is an angle-dependent resonance in the UV, while the resonance in the visible is constant for all wavelengths, regardless of angle. This occurs because there is no angle variation experienced by the features responsible for coupling to those wavelengths. A similar situation occurs in FIG. 6(*b*) with constant wavelength resonance occurring in the UV wavelengths, while varying the angle Φ experienced by the PC only changes its coupling to the larger PC features and shows angle dependent variation at wavelengths greater than $\lambda=450$ nm.

Figure 7:
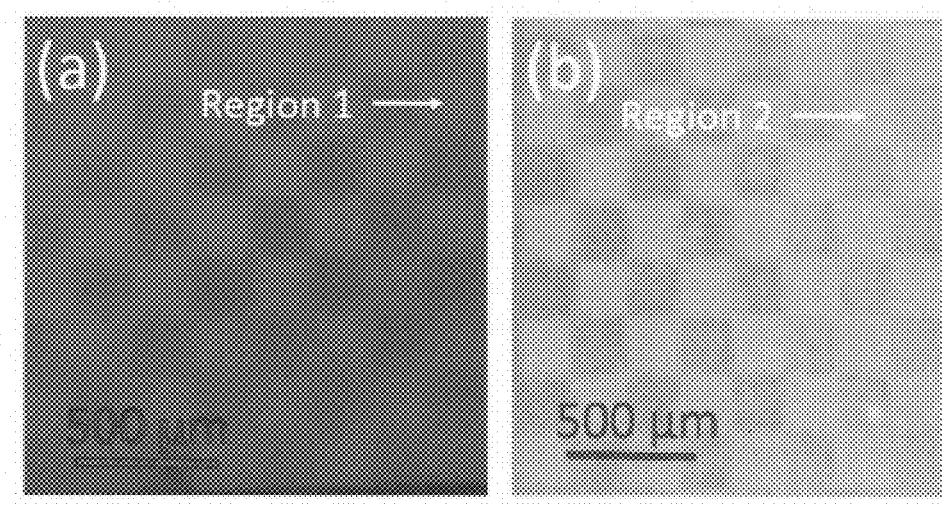
FIG. 7 (which includes FIGS. 7A and 7B) shows photomicrographs quantum dot enhancement within PC regions.

The enhancement of QDs in a region with PC coupling is substantial enough to be easily visible to the naked eye. FIG. 7 shows photographs of two dual-region QD-doped PCs with emissions at from $\lambda=490$ nm and $\lambda=585$ nm. The brighter regions are providing both enhanced excitation and extraction for the embedded QDs. The alternate regions have a resonance condition of the PC that is coupling only to the excitation wavelength, and appears darker due to the lack of an extraction enhancement.

Discussion

Devices using the PC structure demonstrated in this example combine enhancement of the excitation and extraction of up to 5.8× the QD output produced with no PC structure present. There is an expected difference between the improvements in excitation and extraction, given that QDs are dispersed through both regions of the PC structure. Therefore, the QDs in every region experience enhancement of the UV excitation wavelength, but the output wavelengths are enhanced only in one region, or half the total device area.

The enhancements offered by this approach may be further improved in a number of ways. For instance, by optimizing the feature sizes for specific colors, the PCs may be designed to better couple to the emission and excitation wavelengths of the desired QDs, increasing the local electric field within the PC, and thus the enhancement experienced in the QD output. Specifically placing the QDs only in the PC pixel region where they would experience both excitation and extraction would decrease the quantities of QDs required and also extract light more effectively.

A device also may be designed to utilize a non-UV excitation source simply by adjusting the design parameters to couple to a different wavelength. Pixel patterning also can create regions with no PC structure at all, allowing only the excitation source light to pass through, thus increasing the flexibility of color mixing options for lighting.

The use of nonreplica molding for fabrication makes it possible to scale up to large area fabrication of flexible substrates. With appropriate materials, large area, flexible displays and light sources can be constructed to use pixelated PC enhancement. The use of PCs in lighting and displays gives the advantage of angle steering possible with PC enhancement to broaden or narrow the output angles and control the directivity of light output in both lighting and displays. Polarization control is also possible with a PC, and could eliminate for example up to at least 50% loss of backlight power by providing an initially polarized output in display technology.

The technological opportunities afforded by PCs combined with the levels of enhancement possible using QD-embedded PC devices may be a key enabler for the affordable incorporation of QDs into novel lighting and display applications. The enhancements require lower concentrations of QDs and could advance the color purity and performance of QD-based light sources towards consumer applications.

The devices in this example demonstrate the incorporation of QDs into a replica molded 2-dimensional PC. The PC has distinct periods in orthogonal axes, allowing one direction of the structure to resonantly couple the UV LED excitation source to the embedded QDs, The orthogonal direction resonantly couples to the OD emission in the visible spectrum, enhancing the extraction of photons normal to the device surface. These structures have demonstrated combined excitation and extraction enhancements up to 5.8× output intensity, using an approach that interleaves PC regions and enables design-selectable resonant properties, allowing different types of QDs to be embedded into the device and experiencing simultaneous enhancement from the same excitation source, but different extracted wavelengths. The resulting pixelated surface on a flexible substrate enables blending of the color and directional output of multiple QD emission wavelengths for potential lighting or display applications.

What is claimed is:

1. A structure comprising:
   a substrate having a first surface and a second surface; and
   a polymeric layer disposed on the first surface of the substrate, the polymeric layer comprising a polymer and a plurality of light-emitting nanocrystals;
   the polymeric layer having a patterned surface, the patterned surface having a patterned first region having a first plurality of recesses and a patterned second region having a second plurality of recesses, wherein the plurality of recesses in each region has a first periodicity in a first direction, and a second periodicity in a second direction which intersects the first direction, wherein the first periodicity of the first region is different from the first periodicity of the second region.

2. The structure of claim 1 wherein the second periodicity of the first region is the same as the second periodicity of the second region.

3. The structure of claim 1 wherein the polymeric layer comprises a plurality of first regions and a plurality of second regions.

4. The structure of claim 3 wherein the first and second regions are in an alternating relationship to each other.

5. The structure of claim 1 wherein the light-emitting nanocrystals comprise one or more heterojunctions.

6. The structure of claim 1 wherein the light-emitting nanocrystals comprise quantum dots.

7. The structure of claim 1 wherein the substrate is optically transparent.

8. The structure of claim 1 wherein a layer of a material having a higher index of refraction than the polymeric layer is disposed on the patterned surface of the polymeric layer.

9. The structure of claim 1 wherein the second direction intersects the first direction at an angle of from 65 to 115°.

10. The structure of claim 1 wherein the second direction is substantially orthogonal to the first direction.

11. A method of forming a light-emitting system comprising forming the structure of claim 1.

12. The method of claim 11 wherein the polymeric layer comprises a plurality of first regions and a plurality of second regions.

13. A light-emitting apparatus comprising:
   a structure comprising;
   a substrate having a first surface and a second surface;
      a polymeric layer disposed on the first surface of the substrate, the polymeric layer comprising a polymer and a plurality of light-emitting nanocrystals;
      the polymeric layer having a patterned surface, the patterned surface having a patterned first region having a first plurality of recesses and a patterned second region having a second plurality of recesses;
      wherein the plurality of recesses in each region has a first periodicity in a first direction, and a second periodicity in a second direction which intersects the first direction, wherein the first periodicity of the first region is different from the first periodicity of the second region;
   a layer of a material having a higher index of refraction than the polymeric layer is disposed on the patterned surface of the polymeric layer; and a light source arranged to provide light to the second surface of the substrate.

14. The light emitting apparatus of claim 13 wherein the first periodicity is operable to outcouple light emission in a defined direction.

15. The light emitting apparatus of claim 13 wherein the first periodicity is operable to outcouple light emission in a direction that is normal to the first surface of the substrate.

* * * * *